US012527081B2

(12) United States Patent
Chiang et al.

(10) Patent No.: US 12,527,081 B2
(45) Date of Patent: Jan. 13, 2026

(54) SEMICONDUCTOR DEVICE AND LOGIC DEVICE

(71) Applicant: Taiwan Semiconductor Manufacturing Company, Ltd., Hsinchu (TW)

(72) Inventors: Hung-Li Chiang, Taipei (TW); Jer-Fu Wang, Taipei (TW); Iuliana Radu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 394 days.

(21) Appl. No.: 18/165,867

(22) Filed: Feb. 7, 2023

(65) Prior Publication Data

US 2024/0178228 A1 May 30, 2024

Related U.S. Application Data

(60) Provisional application No. 63/427,886, filed on Nov. 24, 2022.

(51) Int. Cl.
| | |
|---|---|
| *H10D 84/85* | (2025.01) |
| *H01L 23/528* | (2006.01) |
| *H10D 30/43* | (2025.01) |
| *H10D 30/67* | (2025.01) |
| *H10D 62/10* | (2025.01) |

(52) U.S. Cl.
CPC ....... *H10D 84/856* (2025.01); *H01L 23/5286* (2013.01); *H10D 30/43* (2025.01); *H10D 30/6729* (2025.01); *H10D 30/6735* (2025.01); *H10D 62/121* (2025.01); *H10D 62/122* (2025.01)

(58) Field of Classification Search
CPC .. H01L 23/5286; H10D 30/014; H10D 30/43; H10D 30/6729; H10D 30/6735; H10D 30/6757; H10D 62/121; H10D 62/122; H10D 84/0167; H10D 84/017; H10D 84/0186; H10D 84/038; H10D 84/85; H10D 84/856; H10D 88/00; H10D 88/01
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |

(Continued)

*Primary Examiner* — Edward Chin
(74) *Attorney, Agent, or Firm* — JCIPRNET

(57) ABSTRACT

A semiconductor device and a logic device formed of the semiconductor device are provided. The semiconductor device includes a first field effect transistor (FET), disposed on a semiconductor substrate, and including vertically separated first channel structures formed as thin sheets each having opposite major planar surfaces facing toward and away from the semiconductor substrate; and a second FET, disposed on the semiconductor substrate and overlapped with the first FET. A conductive type of the second FET is complementary to a conductive type of the first FET. Second channel structures of the second FET are separately arranged along a lateral direction, and formed as thin walls.

20 Claims, 15 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2023/0299085 A1* | 9/2023 | Xie ........................ H10D 88/01 257/351 |

* cited by examiner

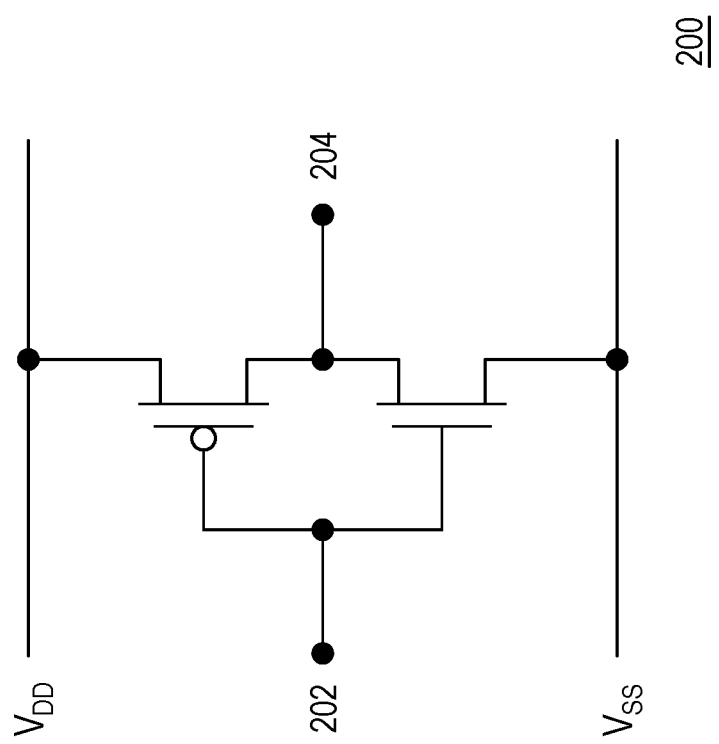

SEMICONDUCTOR DEVICE AND LOGIC DEVICE

CROSS-REFERENCE TO RELATED APPLICATION

This application claims the priority benefit of U.S. provisional application Ser. No. 63/427,886, filed on Nov. 24, 2022. The entirety of the above-mentioned patent application is hereby incorporated by reference herein and made a part of this specification.

BACKGROUND

Semiconductor industry has experienced rapid growth due to continuous improvement in integration density of various electronic devices (e.g., transistors, diodes, capacitors or the like). Particularly, increasing the integration density may result in benefits in terms of device speed and manufacturing cost. For the most part, improvement in the integration density has come from repeated reductions in feature size of the electronic devices. Let alone difficulties in manufacturing the electronic devices with finer feature size, the feature size are getting closer to physical limit. A more innovated approach for further increasing the integration density is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a circuit diagram illustrating an inverter formed by a PFET and an NFET stacked on the PFET, according to some embodiments of the present disclosure.

DETAILED DESCRIPTION

Figure 1A:
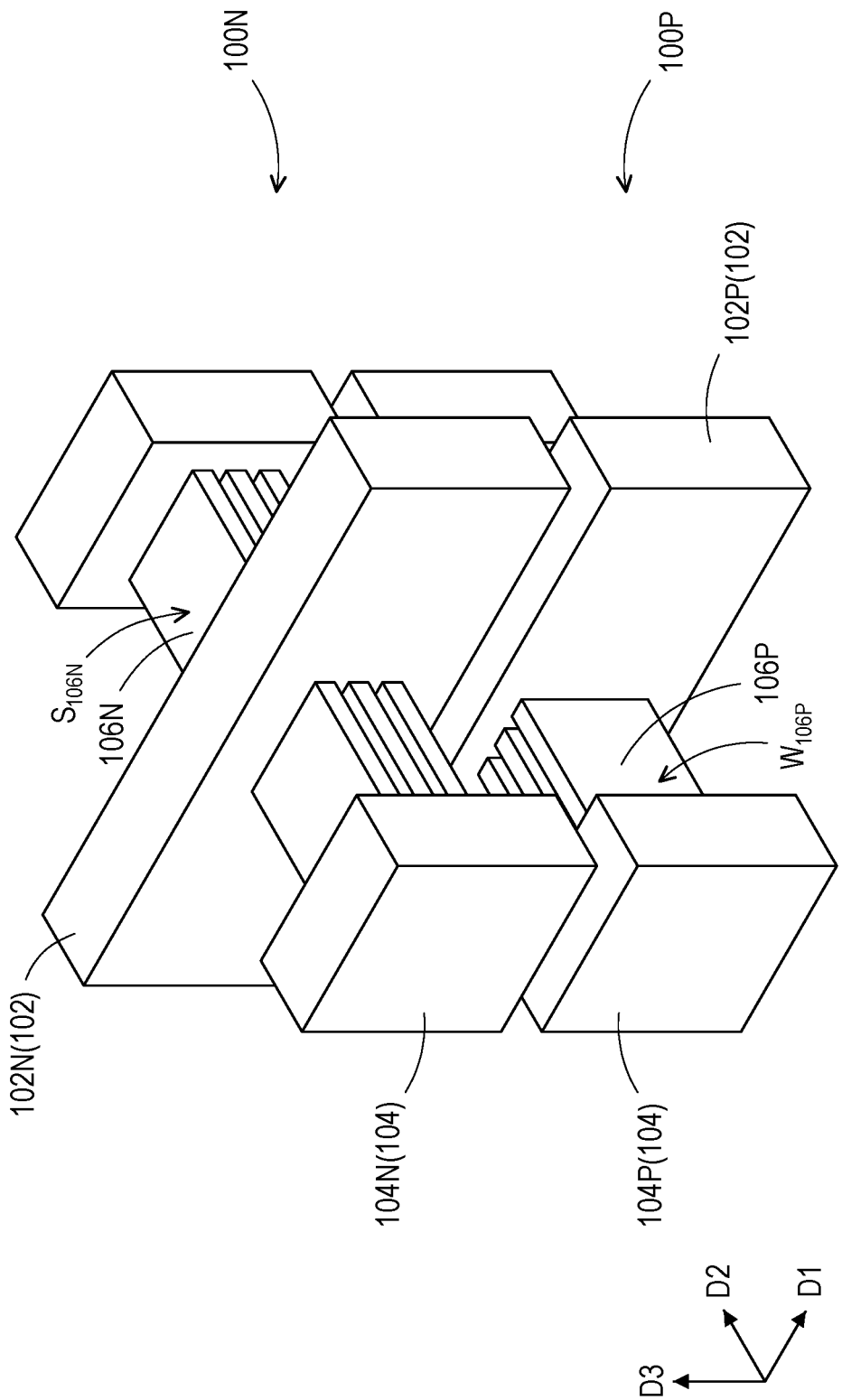
FIG. 1A is a schematic three-dimensional view illustrating a PFET and an NFET stacked on the PFET, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Combinations of N-type field effect transistors (NFETs) and P-type FETs (PFETs) are essential to an integrated circuit. The NFETs and the PFETs can be interconnected to form various logic devices, and provide a wide variety of functionality for the integrated circuit. Instead of shrinking the NFETs and the PFETs individually, various embodiments of the present disclosure provide another approach to increase integration density of the NFETs and the PFETs, while performances of the NFETs and the PFETs can be optimized independently.

FIG. 1A is a schematic three-dimensional view illustrating a PFET 100P and an NFET 100N stacked on the PFET 100P in an integrated circuit, according to some embodiments of the present disclosure.

Referring to FIG. 1A, the PFET 100P and the NFET 100N respectively include a gate structure 102 as a gate terminal; and a pair of source/drain contacts 104 as source and drain terminals and located at opposite sides of the gate structure 102. Interchangeably, while one of the source/drain contacts 104 is function as a source terminal, the other of the source/drain electrodes 104 is functioned as the drain terminal. The gate structure 102 of the PFET 100P is also referred to as a gate structure 102P, while the gate structure 102 of the NFET 100N is also referred to as a gate structure 102N. In a similar way, the source/drain contacts 104 of the PFET 100P are also referred to as source/drain contacts 104P, and the source/drain contacts 104 of the NFET 100N are also referred to as source/drain contacts 104N.

As the PFET 100P lies below the NFET 100N, the gate structure 102P and the source/drain contacts 104P of the PFET 100P are disposed at a horizontal level lower than a horizontal level where the gate structure 102N and the source/drain contacts 104N of the NFET 100N lie. In some embodiments, the gate structure 102P is overlapped with the gate structure 102N, and the source/drain contacts 104P are overlapped with the source/drain contacts 104N. In these embodiments, a total footprint area of the PFET 100P and the NFET 100N can be minimized. As the integrated circuit may include more combinations of the PFET 100P and the NFET 100N, integration density of the integrated circuit may be significantly increased by stacking the NFETs 100N over the PFETs 100P.

In addition to the gate structure 102P and the source/drain contacts 104P, the PFET 100P include channel structures 106P separately extending through the gate structure 102P and in lateral contact with the source/drain contacts 104P. The source/drain contacts 104P can be switchably in electrical connection through the channel structures 106P, and switching of such electrical connection can be controlled by the gate structure 102P. The channel structures 106P are formed of a semiconducting material, such as crystalline silicon. Further, the channel structures 106P are formed as thin walls, each resemble a vertical two-dimensional structure and have major sidewalls $w_{106P}$ being (110) crystalline planes. As compared to the major sidewalls $W_{106P}$, top and bottom surfaces of each channel structure 106P, which may be (100) crystalline planes, are much smaller in size. Accordingly, holes as carriers of the PFET 100P mostly travel along the (110) crystalline planes through the channel structures 106P. Based on carrier mobility anisotropy, a PFET has a greatest carrier mobility (i.e., hole mobility) when major surfaces of its channel structure are provided by (110) crystalline planes. In other words, by forming the channel structures 106P as thin walls with the major sidewalls $W_{106P}$ being the (110) crystalline planes, the PFET 100P can be operated with a promising carrier mobility. In some embodiments, the channel structures 106P are further doped with N-type dopants. In alternative embodiments, the channel structures 106P are intrinsic.

As the gate structures 102P extend along a first lateral direction D1, the channel structures 106P may extend along a second lateral direction D2 intersected with (e.g., substantially perpendicular to) the first lateral direction D1. In addition, the channel structures 106P may be arranged side-by-side along the first lateral direction D1. Further, the major sidewalls $W_{106P}$ of the channel structures 106P may span along the second lateral direction D2 and a substantially vertical direction D3. In some embodiments, portions of the channel structures 106P covered by the gate structure 102P are completely wrapped around by the gate structure 102P. In these embodiments, the bottom surfaces of the channel structures 106P are elevated from a bottom surface of the gate structure 102P, and the top surfaces of the channel structures 106P are lower than a top surface of the gate structure 102P. Further, the portions of the channel structures 106P embedded in the gate structure 102P are separated by the gate structure 102P. Although the PFET 100P is depicted as having 3 of the channel structures 106P, those skilled in the art can adjust an amount of the channel structures 106P according to circuit design, the present disclosure is not limited thereto.

As similar to the PFET 100P, the NFET 100N over the PFET 100P further includes channel structures 106N separately extending through the gate structure 102N, and in lateral contact with the source/drain contacts 104N. The source/drain contacts 104N can be switchably in electrical connection through the channel structures 106N, and switching of such electrical connection can be controlled by the gate structure 102N. In those embodiments where the gate structure 102N and the source/drain contacts 104N overlap the gate structure 102P and the source/drain contacts 104P, the channel structures 106N may overlap the channel structures 106P as well. As similar to the channel structures 106P, the channel structures 106N are formed of a semiconducting material, such as crystalline silicon. However, the channel structures 106N are formed as a stack of thin sheets, each resemble a planar two-dimensional structure and have major planar surfaces $S_{106N}$ being (100) crystalline planes. As compared to the major planar surfaces $S_{106N}$, sidewalls of each channel structure 106N, which may be (110) crystalline planes, are much smaller in size. Accordingly, electrons as carriers of the NFET 100N mostly travel along the (100) crystalline planes through the channel structures 106N. Based on carrier mobility anisotropy, a NFET has a greatest carrier mobility (i.e., electron mobility) when major surfaces of its channel structure are provided by (100) crystalline planes. In other words, by forming the channel structures 106N as thin sheets with the major planar surfaces $S_{106N}$ being the (100) crystalline planes, the NFET 100N can be operated with a promising carrier mobility. In some embodiments, the channel structures 106N are further doped with P-type dopants. In alternative embodiments, the channel structures 106N are intrinsic.

In those embodiments where the gate structure 102N extends along the first lateral direction D1, the channel structures 106N may extend along the second lateral direction D2, as similar to the channel structures 106P. In addition, the channel structures 106N are stacked along the substantially vertical direction D3, and are separated from one another. Further, the major planar surfaces $S_{106N}$ of the channel structures 106N may face upwardly and downwardly, and may span along the first lateral direction D1 and the second lateral direction D2. In some embodiments, portions of the channel structures 106N covered by the gate structure 102N are completely wrapped around by the gate structure 102N. In these embodiments, the bottommost one of the channel structures 106N is elevated from a bottom surface of the gate structure 102N, and the topmost one of the channel structures 106N is lower than a top surface of the gate structure 102N. Further, the portions of the channel structures 106N embedded in the gate structure 102N are separated by the gate structure 102N. Although the NFET 100N is depicted as having 3 of the channel structures 106N, those skilled in the art can adjust the amount of the channel structures 106N according to circuit design, the present disclosure is not limited thereto.

More features of the PFET 100P and the NFET 100N will be described with reference to cross-sectional views.

Figure 1B:
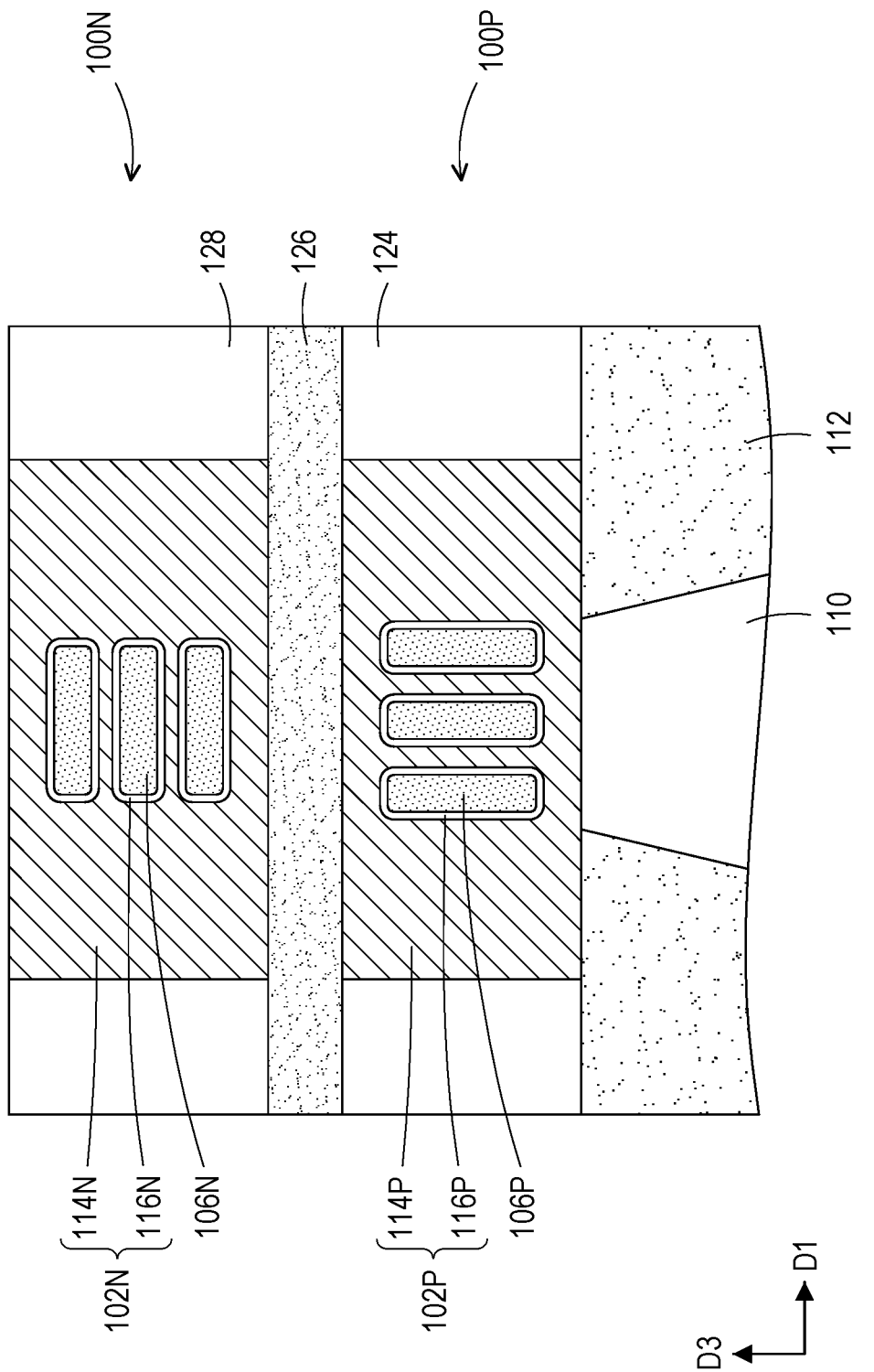
FIG. 1B is a schematic cross-sectional view along gate structures of the PFET and the NFET shown in FIG. 1A, according to some embodiments of the present disclosure.
Figure 1C:
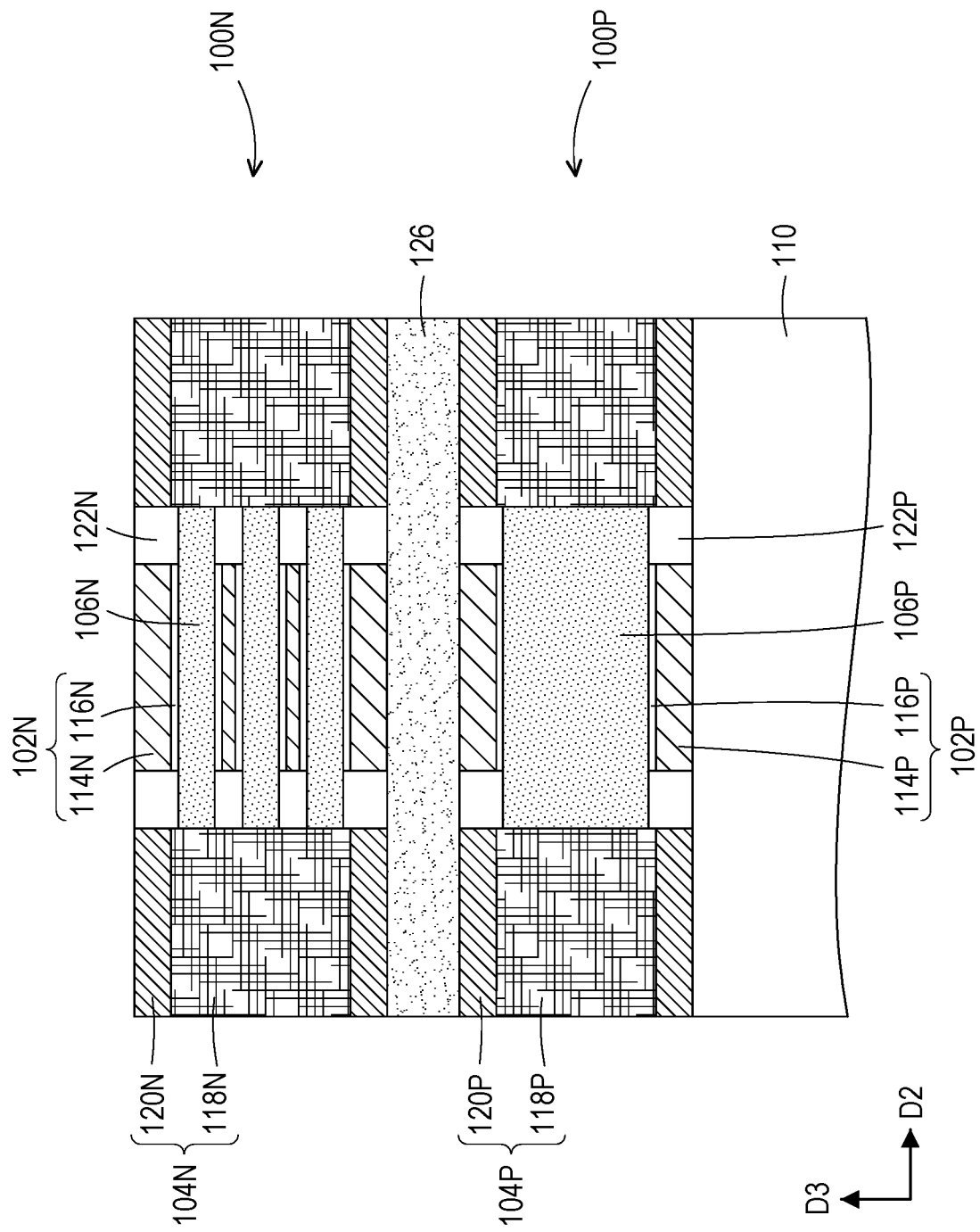
FIG. 1C is a schematic cross-sectional view along channel structures of the NFET and one of channel structures of the PFET as shown in FIG. 1A, according to some embodiments of the present disclosure.

FIG. 1B is a schematic cross-sectional view along the gate structures 102P, 102N of the PFET 100P and the NFET 100N, according to some embodiments of the present disclosure. FIG. 1C is a schematic cross-sectional view along the channel structures 106N and one of the channel structures 106P, according to some embodiments of the present disclosure.

Referring to FIG. 1B and FIG. 1C, the PFET 100P and the NFET 100N are built on a semiconductor substrate 110, such as a silicon wafer. In some embodiments, a top surface of the semiconductor substrate 110 is a (100) crystalline plane. As shown in FIG. 1B, an isolation structure 112 is formed into the semiconductor substrate 110 for defining an active region of the PFET 100P. The active region, which is a portion of the semiconductor substrate 112, may extend along the channel structures 106P, 106N of the PFET 100P and the NFET 100N, as indicated in FIG. 1C.

The channel structures 106P of the PFET 100P formed in wall shapes may be elevated from a top surface of the semiconductor substrate 110, and are wrapped around by the gate structure 102P of the PFET 100P. The gate structure 102P may include a gate electrode 114P intersected with and penetrated through by the channel structures 106P, and include gate dielectric layers 116P separating the channel structures 106P from the gate electrode 114P. Although not shown, one or more work function layer(s) may lie between the gate electrode 114P and the gate dielectric layers 116P, and interfacial layers may respectively extend between one of the channel structures 106P and the covering gate dielectric layer 116P.

As shown in FIG. 1C, the channel structures 106P are in lateral contact with the source/drain contacts 104P. In some embodiments, each source/drain contact 104P includes an epitaxial structure 118P grown from the channel structures 106P, and includes a contact structure 120P covering the epitaxial structure 118P. In some cases, the epitaxial structure 118P may not extend down to the semiconductor substrate 110, and a portion of the contact structure 120P may be filled between the epitaxial structure 118P and the semiconductor substrate 110. In other cases, a bottom surface of the epitaxial structure 118P may be in contact with the semiconductor substrate 110 without the contact structure 120P in between. Further, in some embodiments, the contact structure 120P is formed to a height substantially leveled with a top end of the gate structure 102P.

The gate structure 102P (i.e., the gate electrode 114P of the gate structure 102P) is isolated from the source/drain contacts 104P. In some embodiments, a sidewall spacer 122P is provided along opposite sides of the gate structure 102P, for ensuring electrical isolation between the gate structure 102P and the source/drain contacts 104P. End portions of the channel structures 106P located between the gate structure 102P and the source/drain contacts 104P are covered by the sidewall spacer 122P. As the channel structures 106P are laterally spaced apart from one another, the sidewall spacer 122P may be filled in between the channel structures 106P at opposite sides of the gate structure 102P. In addition, as the channel structures 106P may be elevated from the semiconductor substrate 110, a bottom portion of the sidewall spacer 122P may be filled in between the channel structures 106P and the semiconductor substrate 110 at opposite sides of the gate structure 102P. Further, in some embodiments, a top end of the sidewall spacer 122P is substantially leveled with the top ends of the gate structure 102P and the source/drain contacts 104P.

Moreover, as indicated by FIG. 1B, the PFET 100P is embedded in a dielectric layer 124. The gate structure 102P along with the sidewall spacer 122P and the source/drain contacts 104P (shown in FIG. 1C) are laterally surrounded by the dielectric layer 124. In some embodiments, a top surface of the dielectric layer 124 is substantially leveled with the top ends of the gate structure 102P, the sidewall spacer 122P and the source/drain contacts 104P.

According to some embodiments, an insulating spacer layer 126 is provided to separate the PFET 100P at a ground level from the NFET 100N at an elevated level. In these embodiments, the spacer layer 126 may extend along top surfaces of the gate structure 102P, the sidewall spacer 122P, the source/drain contacts 104P and the dielectric layer 124, and the NEFT 100N is built on the spacer layer 126.

The channel structures 106N of the NFET 100N formed in sheet shapes may be elevated from a top surface of the spacer layer 126, and are wrapped around by the gate structure 102N of the NFET 100N. As similar to the gate structure 102P of the PFET 100P, the gate structure 102N may include a gate electrode 114N intersected with and penetrated through by the channel structures 106N, and include gate dielectric layers 116N separating the channel structures 106N from the gate electrode 114N. According to some embodiments, the gate electrode 114N may be formed of a conductive material different from a conductive material for forming the gate electrode 114P of the gate structure 102P in the PFET 100P. In alternative embodiments, the gate electrodes 114N, 114P are formed of the same conductive material. Although not shown, one or more work function layer(s) may lie between the gate electrode 114N and the gate dielectric layers 116N, and interfacial layers may respectively extend between one of the channel structures 106N and the covering gate dielectric layer 116N.

As shown in FIG. 1C, the channel structures 106N are in lateral contact with the source/drain contacts 104N. In some embodiments, each source/drain contact 104N includes an epitaxial structure 118N grown from the channel structures 106N, and includes a contact structure 120N covering the epitaxial structure 118N. In terms of material, the epitaxial structure 118N may be different from the epitaxial structure 118P in each source/drain contact 104P of the PFET 100P. For instance, the epitaxial structure 118N may be formed of silicon carbide, while the epitaxial structure 118P may be formed of silicon germanium. Alternatively, the epitaxial structures 118N, 118P may be formed of the same material. In addition, in some cases, the epitaxial structure 118N may not extend down to the spacer layer 126, and a portion of the contact structure 120N may be filled between the epitaxial structure 118N and the spacer layer 126. In other cases, a bottom surface of the epitaxial structure 118N may be in contact with the spacer layer 126 without the contact structure 120N in between. Further, in some embodiments, the contact structure 120N is formed to a height substantially leveled with a top end of the gate structure 102N.

The gate structure 102N (i.e., the gate electrode 114N of the gate structure 102N) is isolated from the source/drain contacts 104N. In some embodiments, a sidewall spacer 122N is provided along opposite sides of the gate structure 102N, for ensuring electrical isolation between the gate structure 102N and the source/drain contacts 104N. End portions of the channel structures 106N extending between the gate structure 102N and the source/drain contacts 104N are wrapped around by the sidewall spacer 122N. In some embodiments, a top end of the sidewall spacer 122N is substantially leveled with the top ends of the gate structure 102N and the source/drain contacts 104N.

Further, as indicated by FIG. 1B, the NFET 100N is embedded in a dielectric layer 128 formed on the spacer layer 126. The gate structure 102N along with the sidewall spacer 122N and the source/drain contacts 104N (shown in FIG. 1C) are laterally surrounded by the dielectric layer 128. In some embodiments, a top surface of the dielectric layer 128 is substantially leveled with the top ends of the gate structure 102N, the sidewall spacer 122N and the source/drain contacts 104N.

Although not shown, the integrated circuit may include more of the stack of the PFET 100P and the NFET 100N formed on the semiconductor substrate 110, and an interconnection structure may be formed on these stacks for routing the PFETs 100P and the NFETs 100N therein. Depending on circuit design, the gate structures 102P, 102N in each stack may be optionally connected through a conductive via extending through the spacer layer 126. Also, as an option, additional conductive via(s) penetrating through the spacer layer 126 may be used for establishing electrical connection from one of the source/drain contacts 104P of the PFET 100P to one of the source/drain contacts 104N of the NFET 100N, or from both of the source/drain contacts 104P to both of the source/drain contacts 104N. For some applications that the PFET 100P and the NFET 100N are required to be powered, at least one of the source/drain contacts 104P of the PFET 100P and at least one of the source/drain contacts 104N of the NFET 100N are each connected to a buried power rail embedded in the isolation structure 112 or a power rail formed in the interconnection structure stacked over the NFET 100N.

Figure 2B:
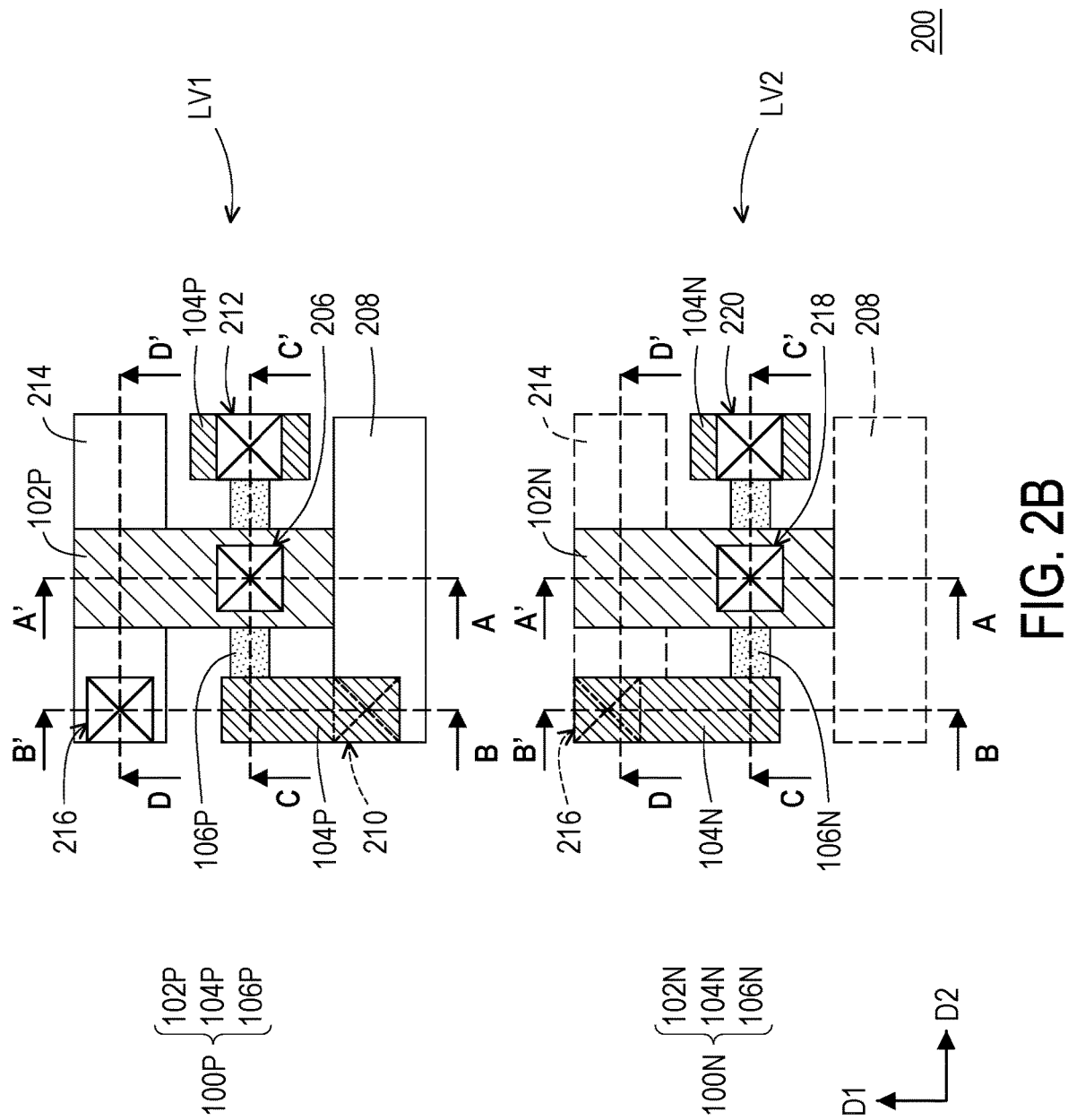
FIG. 2B illustrates a layout design of the inverter as shown in FIG. 2A, according to some embodiments of the present disclosure.

FIG. 2A is a circuit diagram illustrating an inverter 200 formed by the PFET 100P and the NFET 100N stacked on the PFET 100N, according to some embodiments of the present disclosure. FIG. 2B illustrates a layout design of the inverter 200, according to some embodiments of the present disclosure.

Referring to FIG. 2A, as an example, the PFET 100P and the NFET 100N in the same stack can be interconnected to form an inverter 200. Particularly, gate terminals of the PFET 100P and the NFET 100N are connected to an input terminal 202 of the inverter 200. In addition, one of the source and drain terminals of the PFET 100P and one of the source and drain terminals of the NFET 100N are connected to an output terminal 204 of the inverter 200. Further, the other one of the source and drain terminals of the PFET 100P may be coupled to a power supply voltage $V_{DD}$, whereas the other one of the source and drain terminals of the NFET 100N may be coupled to a reference voltage $V_{SS}$, such as a ground voltage.

When a logic high voltage is provided to the input terminal 202, the NFET 100N would be turned on, while the PFET 100P would stay in an off state. As a result, the output terminal 204 would be pulled down by the reference voltage $V_{SS}$ and decoupled from the power supply voltage $V_{DD}$, and a logic low voltage at the output terminal 204 would be resulted. On the other hand, when a logic low voltage is provided to the input terminal 202, the PFET 100P would be turned on, while the NFET 100N would be in an off state. Accordingly, the output terminal 204 may be pulled up by the power supply voltage $V_{DD}$ and decoupled from the reference voltage $V_{SS}$. Therefore, a logic high voltage at the output terminal 204 would be resulted. In this way, a logic signal can be inverted by the inverter 200.

Referring to FIG. 2B, the inverter 200 is formed as a two-story structure. A first sub-layout LV1 shows a portion of the inverter 200 at a ground level, and a second sub-layout LV2 shows another portion of the inverter 200 at an elevated level. In order to be illustrated individually, the first and second sub-layouts LV1, LV2 are depicted as being laterally offset from each other. However, the first sub-layout LV1 should actually lie below the second sub-layout LV2.

The PFET 100P is laid in the first sub-layout LV1 at the ground level. As described with reference to FIG. 1A, the PFET 100P includes the gate structure 102P, the source/drain contacts 104P and the channel structures 106P (which are depicted as a single element in FIG. 2B). The gate structure 102P may extend along the first lateral direction D1, and the channel structures 106P may extend along the second lateral direction D2, and penetrate through the gate structure 102P. The source/drain contacts 104P are laid at opposite sides of the gate structure 102P, and are in lateral contact with the channel structures 106P. A conductive via 206 may stand on the gate structure 102P, and connect the gate structure 102P to the gate structure 102N of the NFET 100N laid in the second sub-layout LV2 at the elevated level. One of the source/drain contacts 104P may be connected to a buried power rail 208 coupled to the power supply voltage $V_{DD}$. As will be further described, the buried power rail 208 is embedded in the isolation structure 112 formed into the semiconductor substrate 110. In some embodiments, the buried power rail 208 extends along the second lateral direction D2, and is substantially parallel with the channel structures 106P. In these embodiments, the source/drain contact 104P connected to the buried power rail 208 may further extend along the first lateral direction D1 to overlap the buried power rail 208, and a conductive via 210 may be used for connecting this source/drain contact 104P to the underlying buried power rail 208. On the other hand, the other source/drain contact 104P may be connected to one of the source/drain contacts 104N of the NFET 100N laid in the second sub-layout LV2 at the elevated level. A conductive via 212 may be used for connecting this source/drain contact 104P to the overlying source/drain contact 104N.

Further, in addition to the buried power rail 208, another buried power rail 214 may be disposed at the ground level to provide the reference voltage $V_{SS}$ for the NFET 100N laid in the second sub-layout LV2 at the elevated level. As similar to the buried power rail 208, the buried power rail 214 is embedded in the isolation structure 112 formed into the semiconductor substrate 100. In addition, the buried power rail 214 may extend along the second lateral direction D2 at another side of the channel structures 106P facing away from the buried power rail 208. A conductive via 216 may stand on the buried power rail 214 for establishing electrical connection between the buried power rail 214 and the overlying NFET 100N.

The NFET 100N laid in the second sub-layout LV2 at the elevated level includes the gate structure 102N, the source/drain contacts 104N and the channel structures 106N (which are depicted as a single element in FIG. 2B). The gate structure 102N may extend along the first lateral direction D1. In addition, the gate structure 102N may overlap the gate structure 102P of the PFET 100P at the ground level, and may be connected to the gate structure 102P through the conductive via 206. Further, the connected gate structures 102N, 102P may be further coupled to the input terminal of the inverter 200 (i.e., the input terminal 202 as shown in FIG. 2A) through a conductive via 218 standing on the gate structure 102N. The channel structures 106N penetrating through the gate structure 102N and in lateral contact with the source/drain contacts 104N may extend along the second lateral direction D2, and may overlap the channel structures 106P of the PFET 100P at the ground level. As described above, one of the source/drain contacts 104N may be connected to one of the source/drain contacts 104P of the PFET 100P at the ground level through the conductive via 212, and may overlap this underlying source/drain contact 104P. Further, the connected source/drain contacts 104N, 104P may be further coupled to the output terminal of the inverter 200 (i.e., the output terminal 204 as shown in FIG.

2A) through a conductive via 220 standing on this source/drain contact 104N. On the other hand, the other source/drain contact 104N may further extend to overlap the buried power rail 214, and may be connected to the buried power rail 214 through the conductive via 216. As the buried power rails 208, 214 are disposed at opposite sides of the channel structures 106P, 106N, the source/drain contact 104P connected to the buried power rail 208 and the source/drain contact 104N connected to the buried power rail 214 may extend from the channel structures 106P/106N in opposite ways.

It should be appreciated that dielectric elements in the PFET 100P and the NFET 100N (e.g., the isolation structure 112, the sidewall spacers 122P, 122N, the dielectric layers 124, 128 and the spacer layer 126) are omitted from illustration in FIG. 2B. Nevertheless, these dielectric elements are shown in the schematic cross-sectional views in FIG. 2C through FIG. 2F, along with other detailed structures.

Figure 2C:
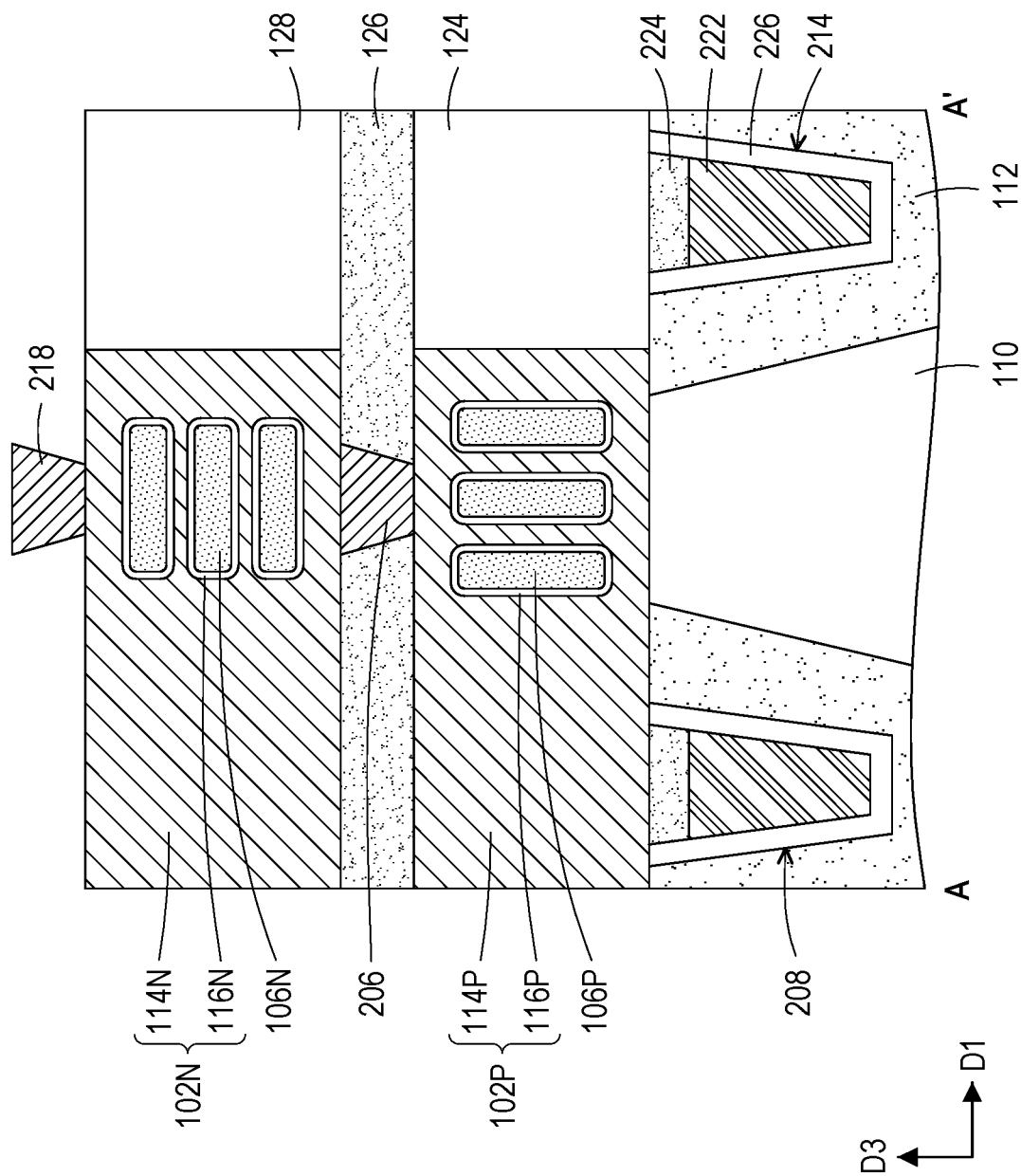
FIG. 2C is a schematic cross-sectional view along an A-A' line shown in FIG. 2B.
Figure 2D:
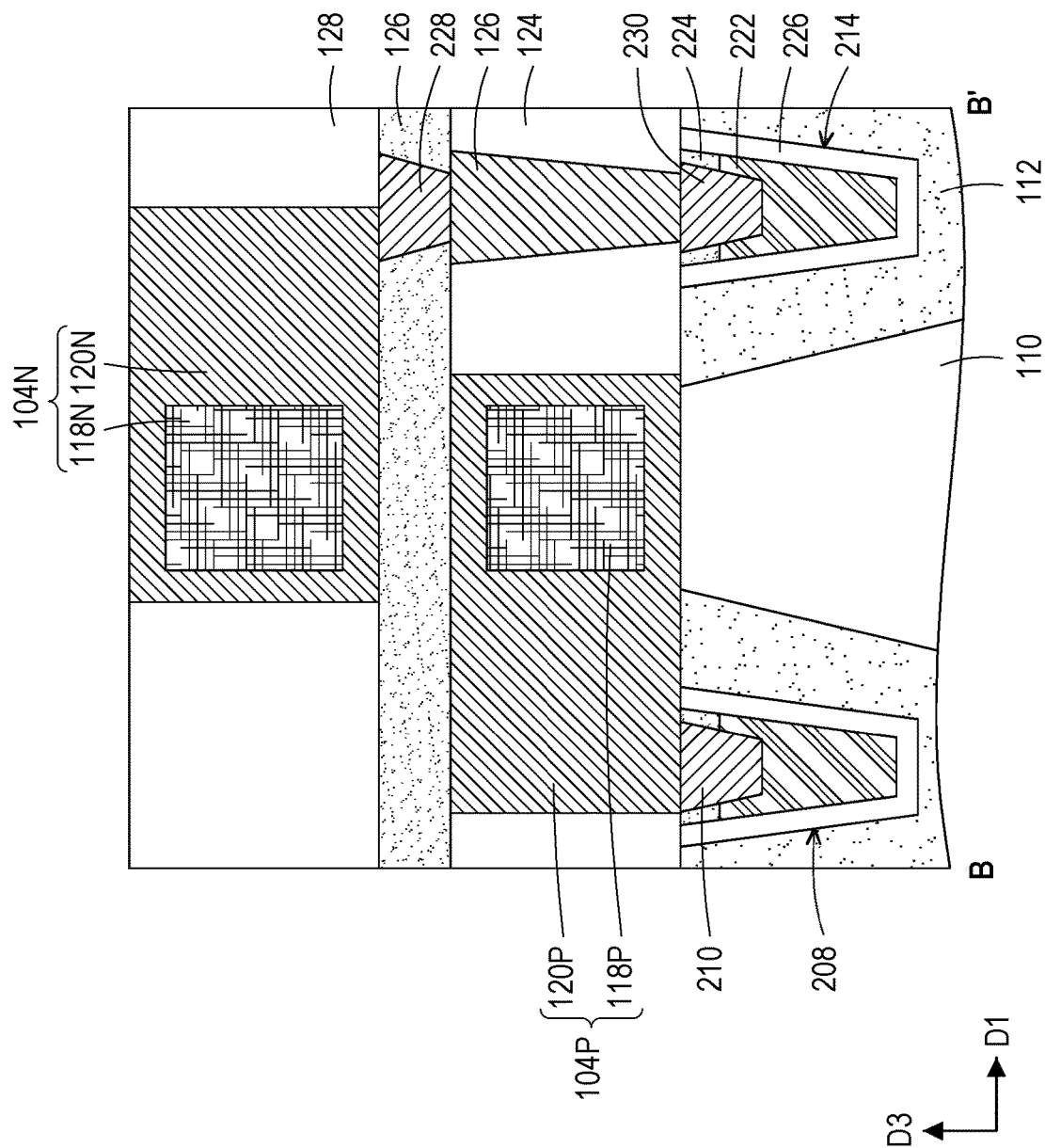
FIG. 2D is a schematic cross-sectional view along a B-B' line shown in FIG. 2B.
Figure 2E:
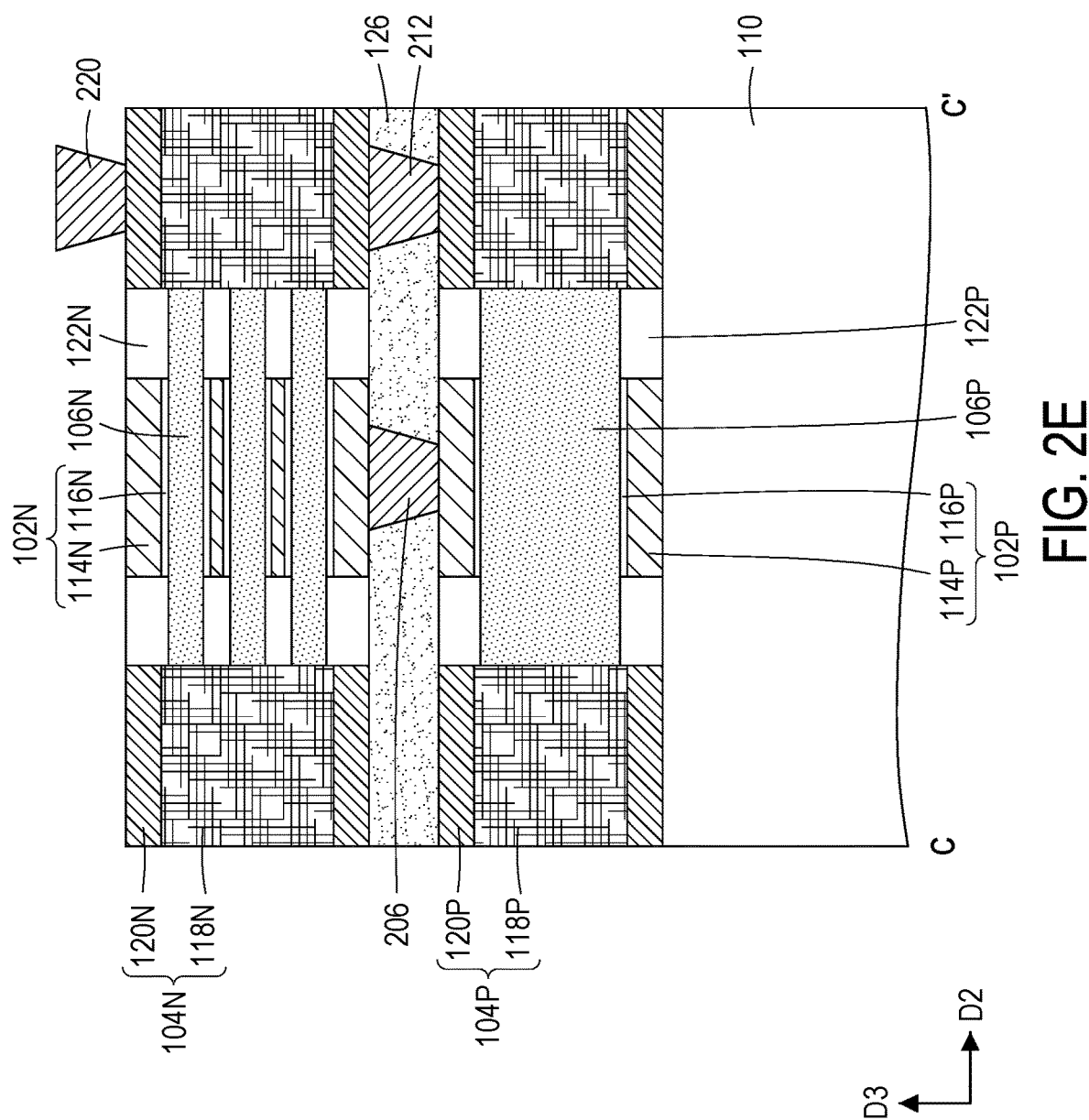
FIG. 2E is a schematic cross-sectional view along a C-C' line shown in FIG. 2B.
Figure 2F:
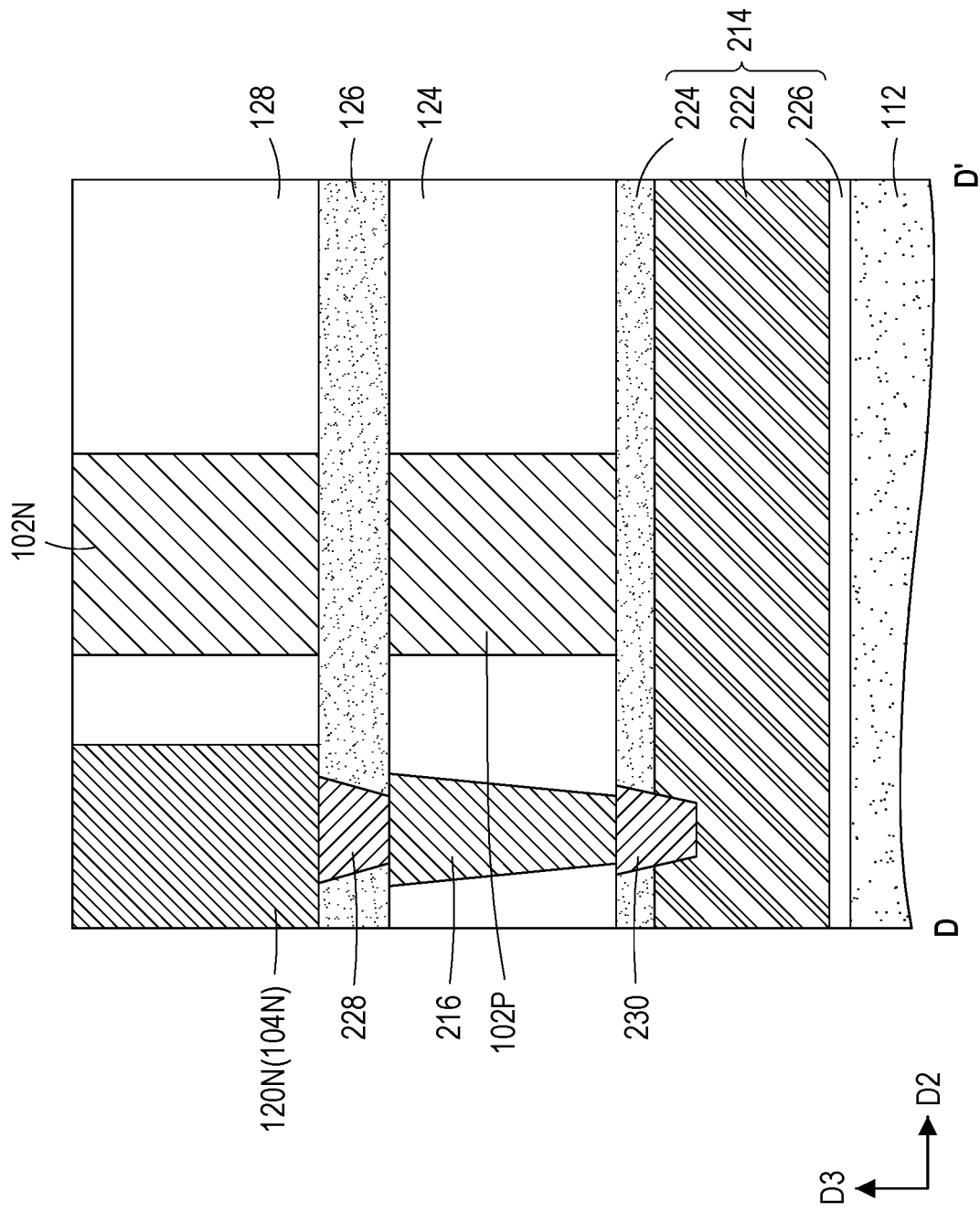
FIG. 2F is a schematic cross-sectional view along a D-D' line shown in FIG. 2B.

FIG. 2C is a schematic cross-sectional view along an A-A' line shown in FIG. 2B; FIG. 2D is a schematic cross-sectional view along a B-B' line shown in FIG. 2B; FIG. 2E is a schematic cross-sectional view along a C-C' line shown in FIG. 2B; and FIG. 2F is a schematic cross-sectional view along a D-D' line shown in FIG. 2B.

As the schematic cross-channel view shown in FIG. 2C, the gate structure 102P wrapping around the channel structures 106P at the ground level is embedded in the dielectric layer 124, while the gate structure 102N wrapping around the channel structures 106N at the elevated level is embedded in the dielectric layer 128. In addition, the gate structures 102P, 102N vertically separated by the spacer layer 126 are electrically connected through the conductive via 206, and are further routed to the input terminal of the inverter 200 (i.e., the input terminal 202 shown in FIG. 2A) by the conductive via 218 standing on the gate structure 102N.

Further, the buried power rails 208, 214 are embedded in the isolation structure 112 formed into the semiconductor substrate 110, and run along the channel structures 106P, 106N at opposite sides of the channel structures 106P, 106N. In some embodiments, each of the buried power rails 208, 214 includes a buried conductive line 222, an insulating capping layer 224 on top of the buried conductive line 222 and an insulating liner 226 separating the conductive line 222 and the insulating capping layer 224 from the isolation structure 112. Although not shown, the buried conductive line 222 in the buried power rails 208, 214 may be routed to a back side of the semiconductor substrate 110 via through substrate vias extending to the buried conductive lines 222 from a back surface of the semiconductor substrate 110, and backside routings spreading at the back side of the semiconductor substrate 110.

As the schematic cross-sectional view cut along the source/drain contacts 104P, 104N connected to the buried power rails 208, 214 shown in FIG. 2D, the contact structure 120P of this source/drain contact 104P at the ground level laterally extends to overlap the buried power rail 208, and the contact structure 120N of this source/drain contact 104N at the elevated level laterally extends to overlap the buried power rail 214. The conductive via 210 is provided for establishing electrical connection between the buried power rail 208 and the contact structure 120P of the source/drain contact 104P at the ground level. The conductive via 210 may be formed through the insulating capping layer 224 of the buried power rail 208, to reach the buried conductive line 222 of the buried power rail 208. Further, the contact structure 120N of the source/drain contact 104N at the elevated level is connected to the buried power rail 214 through the conductive via 216. In some embodiments, the conductive via 216 is located at the ground level, and penetrates through the dielectric layer 124 laterally surrounding the PFET 100P. In these embodiments, the source/drain contact 104N is connected to the conductive via 216 through an additional conductive via 228 in the spacer layer 126, and the conductive via 216 is connected to the buried conductive line 222 of the buried power rail 214 through an additional conductive via 230. As similar to the conductive via 210, the conductive via 230 may be formed through the insulating capping layer 224 of the buried power rail 214, to make contact with the buried conductive line 222 of the buried power rail 214.

As the schematic cross-sectional view cut along the channel structures 106N and one of the channel structures 106P shown in FIG. 2E, the channel structures 106N, 106P laterally penetrating through the gate structures 102N, 102P are in lateral contact with the epitaxial structures 118N, 118P of the source/drain contacts 104N, 104P, and the gate structures 102N, 102P are laterally spaced apart from the source/drain contacts 104N, 104P through the sidewall spacers 122N, 122P. Further, the source/drain contacts 104N, 104P vertically separated from each other by the spacer layer 126 are electrically connected by the conductive via 212, and are further routed to the output terminal of the inverter 200 (i.e., the output terminal 204 as shown in FIG. 2A) through the conductive via 220 standing on the source/drain contact 104N.

As the schematic cross-sectional view cut along the buried power rail 214 shown in FIG. 2F, the contact structure 120N of one of the source/drain contacts 104N is connected to the underlying buried power rail 214 through the conductive vias 216, 228, 230. In addition, the gate structure 102P at the ground level may be spaced apart from the buried conductive line 226 through the insulating capping layer 224.

Although not shown, an interconnection structure may be further disposed on the stack of the inverter 200, and the inverter 200 may be further connected to other logic and/or memory devices through conductive features spreading in the interconnection structure. In addition to an inverter, one or more of the stack of the PFET 100P and the NFET 100N may be implemented in any of other logic devices including a combination of PFET(s) and NFET(s). That is, stacks of the PFETs 100P and the NFETs 100N may be interconnected to form an integrated circuit. As compared to arranging PFETs and NFETs at the same level, stacking the NFETs 100N over the PFETs 100P can result in a much smaller footprint area of the integrated circuit. Alternatively, the integrated circuit with stacks of the PFETs 100P and the NFETs 100N may have a much higher integration density. Furthermore, as the channel structures 106P of the PFETs 100P are formed as thin walls with the major sidewalls $W_{106P}$ (as shown in FIG. 1A) being the (110) crystalline planes and the channel structures 106N of the NFETs 100N are formed as thin sheets with the major planar surfaces $S_{106N}$ (as shown in FIG. 1A) being the (100) crystalline planes, the PFETs 100P and the NFETs 100N can both be operated with optimized carrier mobility.

In other embodiments, stacking order of the PFET 100P and the NFET 100N in each stack can be reversed.

Figure 3A:
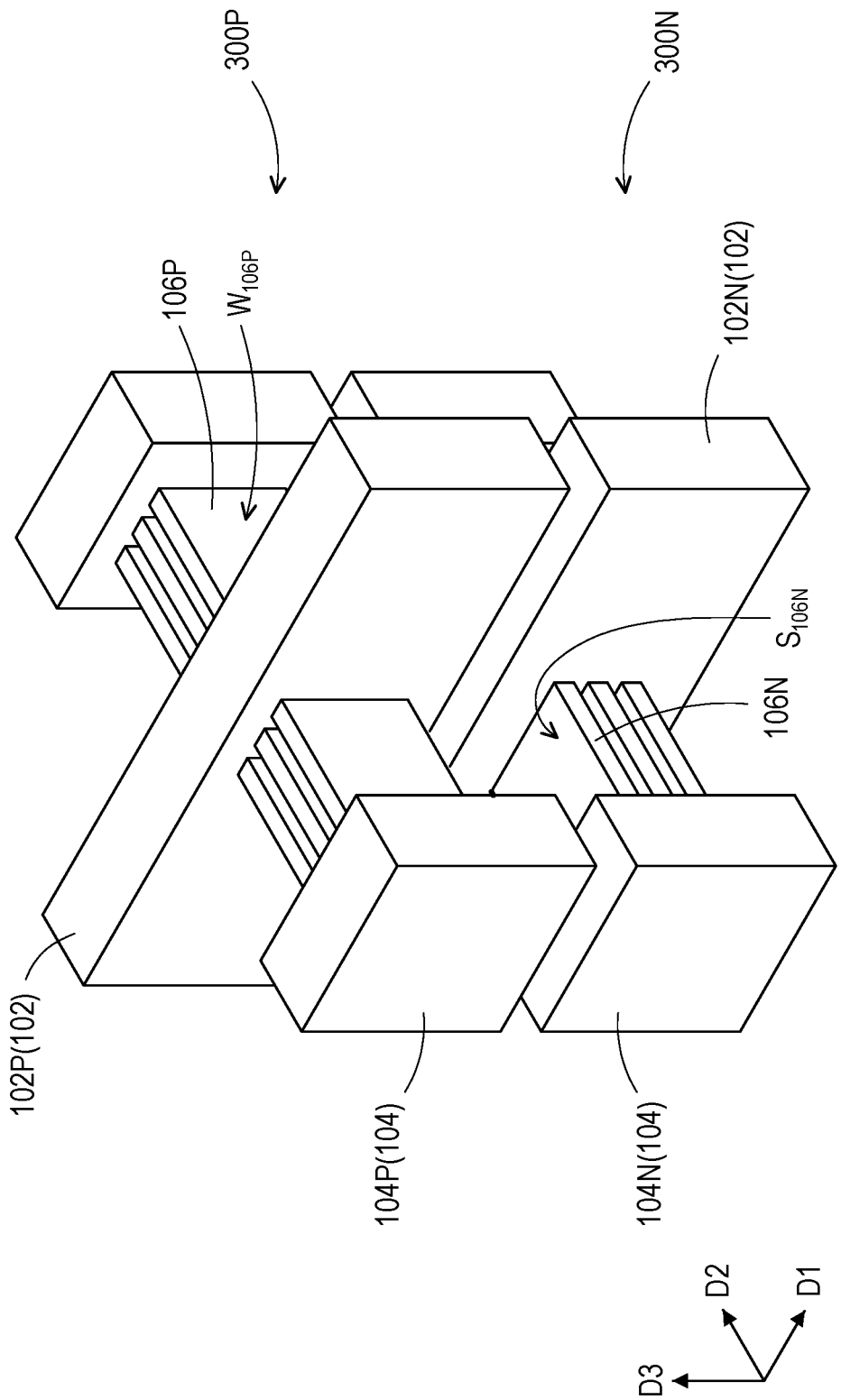
FIG. 3A is a schematic three-dimensional view illustrating a stack of an NFET and a PFET over the NFET, according to some embodiments of the present disclosure.
Figure 3B:
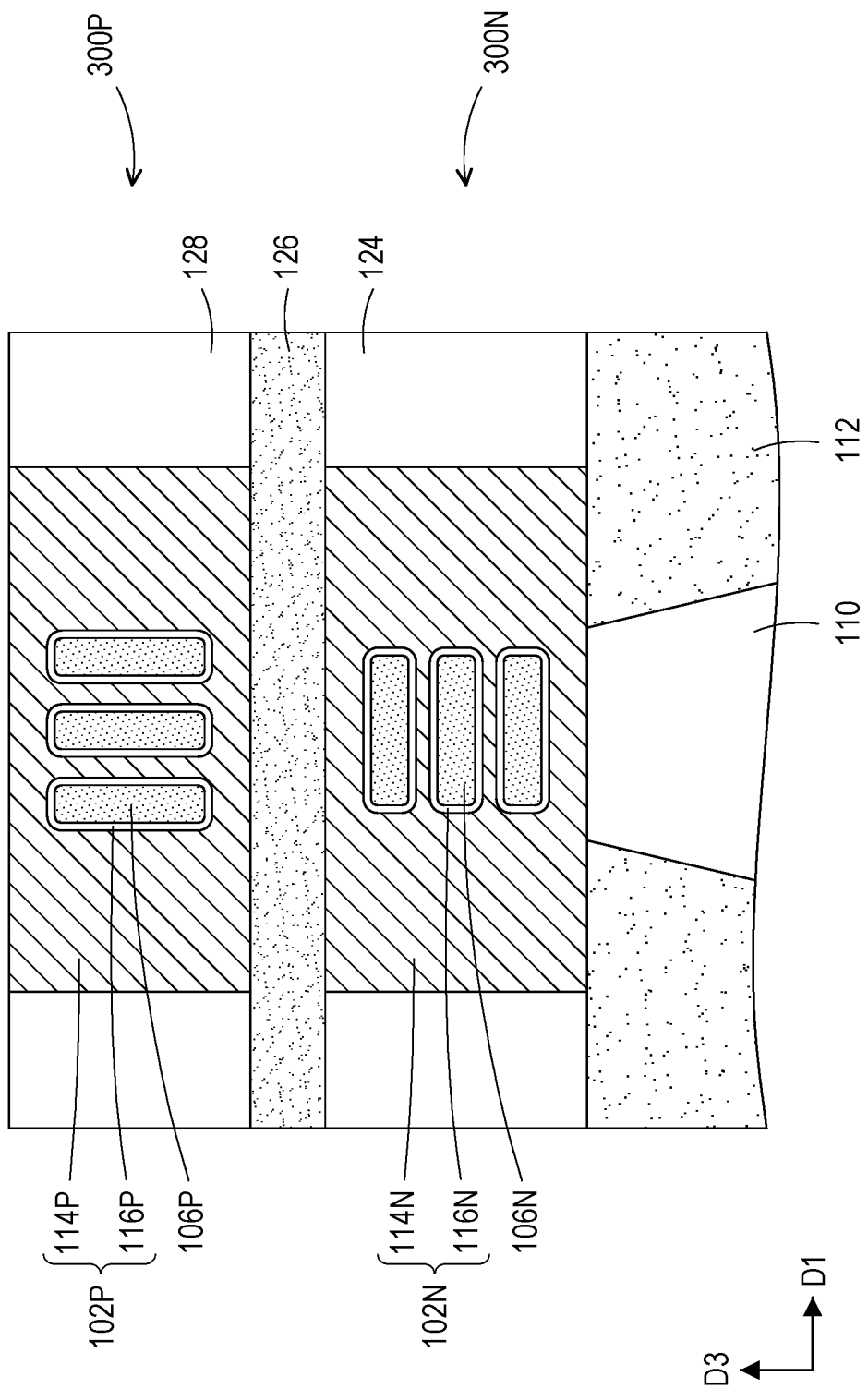
FIG. 3B is a schematic cross-sectional view along gate structures of the NFET and the PFET as shown in FIG. 3A, according to some embodiments of the present disclosure.
Figure 3C:
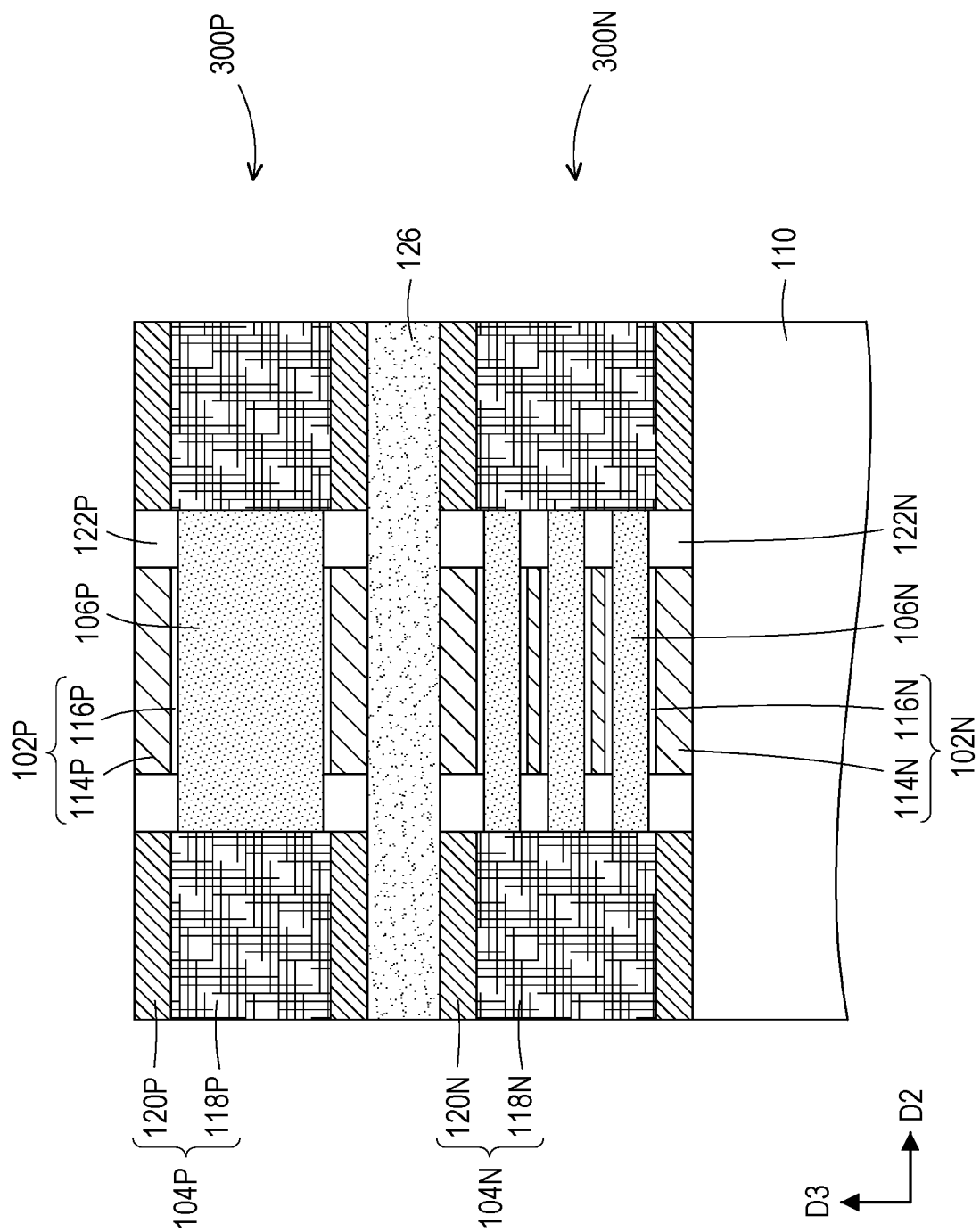
FIG. 3C is a schematic cross-sectional view along channel structures of the NFET and one channel structures of the PFET as shown in FIG. 3A, according to some embodiments of the present disclosure.

FIG. 3A is a schematic three-dimensional view illustrating a stack of an NFET 300N and a PFET 300P over the NFET 300N, according to some embodiments of the present disclosure. FIG. 3B is a schematic cross-sectional view along the gate structures 102N, 102P of the NFET 300N and the PFET 300P, according to some embodiments of the present disclosure. FIG. 3C is a schematic cross-sectional view along the channel structures 106N of the NFET 300N and one of the channel structures 106P of the PFET 300P, according to some embodiments of the present disclosure.

Referring to FIG. 3A through FIG. 3C, in some embodiments, the NFET 300N structurally identical with the NFET 100N described with reference to FIG. 1A through FIG. 1C is located at the ground level, while the PFET 300P structurally identical with the PFET 100P described with reference to FIG. 1A through FIG. 1C is located at the elevated level. Accordingly, as shown in FIG. 3B, the NFET 300N is embedded in the dielectric layer 124, and is separated from the PFET 300P embedded in the dielectric layer 128 via the spacer layer 126 in between.

Optionally, the gate structure 102N of the NFET 300N can be connected to the gate structure 102P of the PFET 300P through a conductive via in the spacer layer 126, as similar to the conductive via 206 shown in FIG. 2C. Also, as an option, additional conductive via(s) penetrating through the spacer layer 126 may be used for establishing electrical connection from one of the source/drain contacts 104N of the NFET 300N to one of the source/drain contacts 104P of the PFET 300P, or from both of the source/drain contacts 104N to both of the source/drain contacts 104P. For some applications that the NFET 300N and the PFET 300P are required to be powered, at least one of the source/drain contacts 104N of the NFET 300N and at least one of the source/drain contacts 104P of the PFET 300P are each connected to a buried power rail embedded in the isolation structure 112 (e.g., the buried power rail 208/214 as shown in FIG. 2D) or a power rail formed in an interconnection structure stacked over the PFET 300P.

As an example, the stack of the NFET 300N and the PFET 300P can be interconnected to form an inverter similar to the inverter 200 described with reference to FIG. 2B through FIG. 2F, except that the PFET 300P would be stacked over the NFET 300N, and the buried power rail 208 would be coupled to the reference voltage $V_{SS}$ while the buried power rail 214 would be coupled to the power supply voltage $V_{DD}$. However, instead of being limited to an inverter, the stack of the NFET 300N and the PFET 300P can be implemented in any of other logic devices including a combination of a NFET and a PFET.

In further embodiments, the NFET and the PFET in the same stack can share a common gate structure.

Figure 4A:
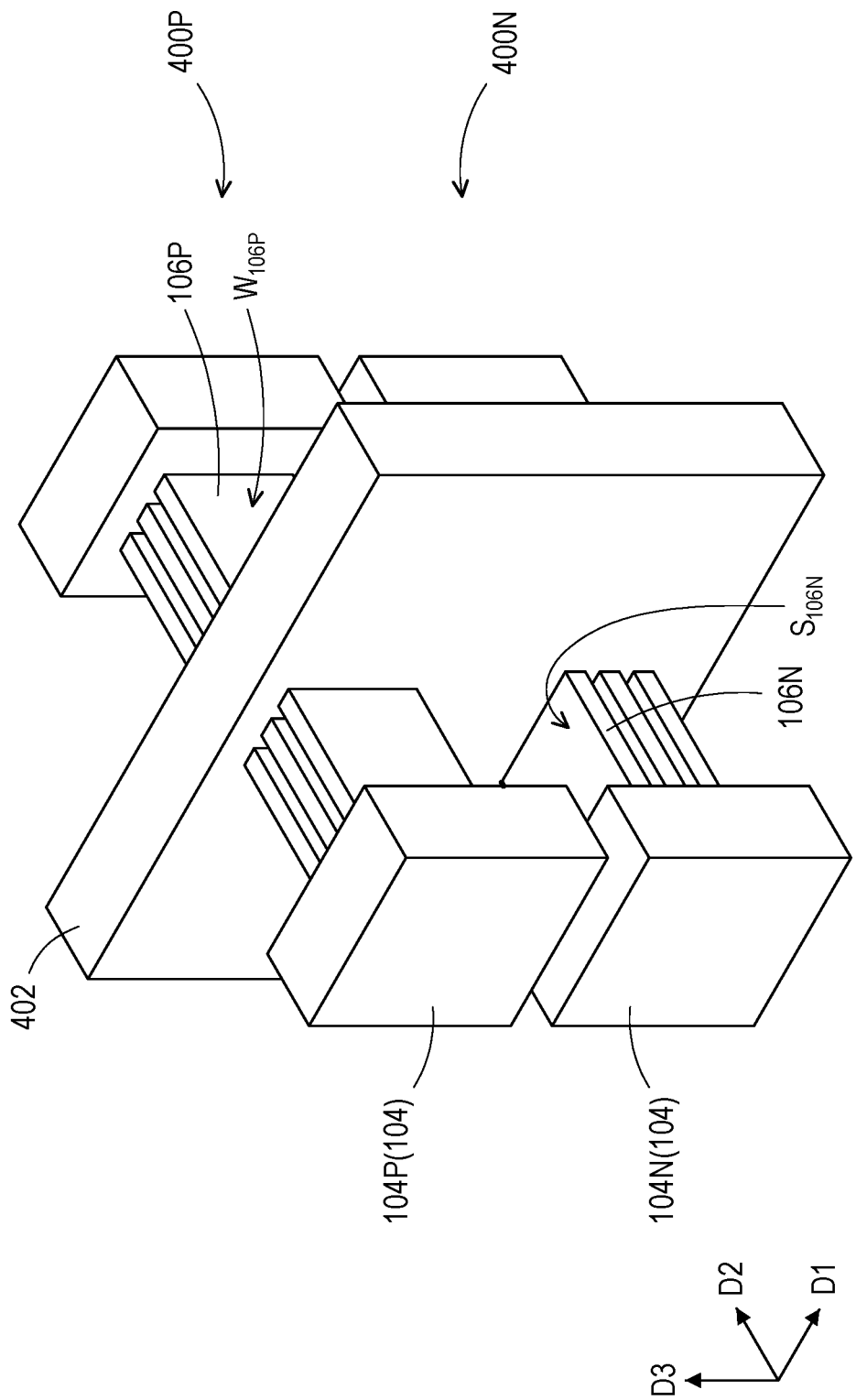
FIG. 4A is a schematic three-dimensional view illustrating a stack of an NFET and a PFET over the NFET, according to some embodiments of the present disclosure.
Figure 4B:
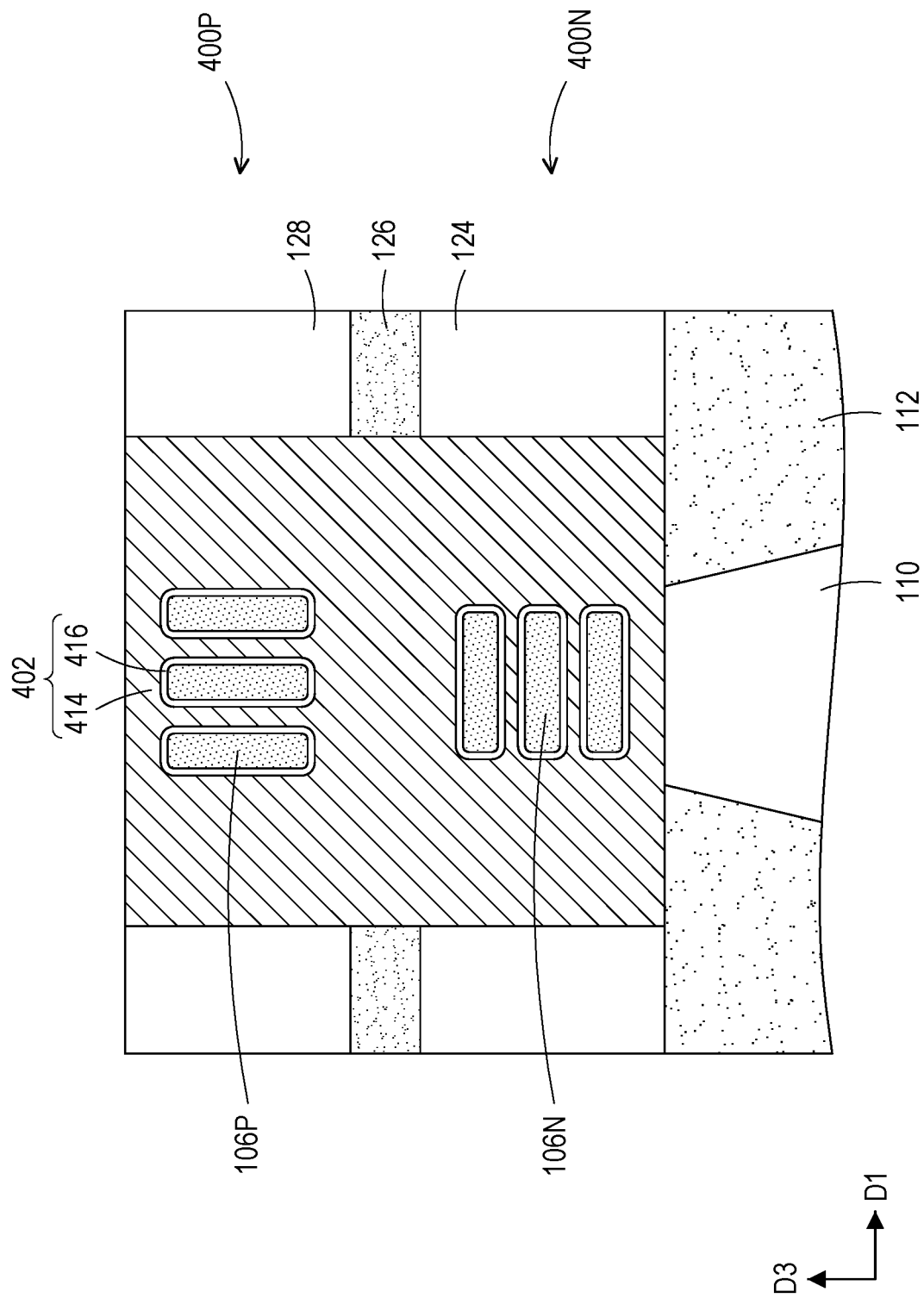
FIG. 4B is a schematic cross-sectional view along a common gate structure of the NFET and the PFET as shown in FIG. 4A, according to some embodiments of the present disclosure.
Figure 4C:
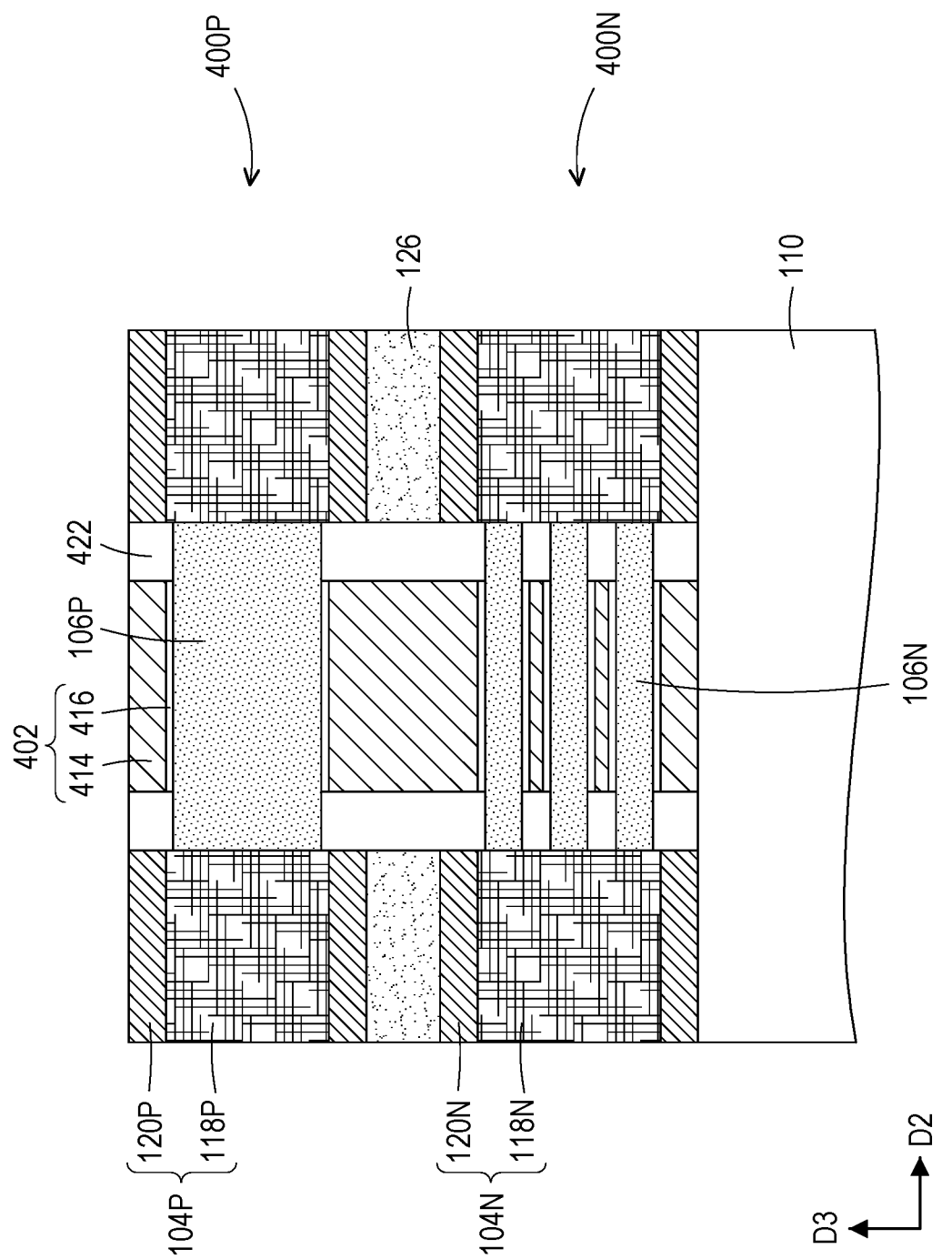
FIG. 4C is a schematic cross-sectional view along channel structures of the NFET and one of channel structures of the PFET as shown in FIG. 4A, according to some embodiments of the present disclosure.

FIG. 4A is a schematic three-dimensional view illustrating a stack of an NFET 400N and a PFET 400P over the NFET 400N, according to some embodiments of the present disclosure. FIG. 4B is a schematic cross-sectional view along a common gate structure 402 of the NFET 400N and the PFET 400P, according to some embodiments of the present disclosure. FIG. 4C is a schematic cross-sectional view along the channel structures 106N of the NFET 400N and one of the channel structures 106P of the PFET 400P, according to some embodiments of the present disclosure.

The NFET 400N and the PFET 400P over the NFET 400N are similar to the NFET 300N and the PFET 300P over the NFET 300N as described with reference to FIG. 3A through FIG. 3C, except that the NFET 400N and the PFET 400P share a common gate structure 402 and a common sidewall spacer 422 (shown in FIG. 4C), rather than having respective gate structures and sidewall spacers. The common gate structure 402 wraps around both of the channel structures 106N of the NFET 400N at the ground floor and the channel structures 106P of the PFET 400P at the elevated level. As similar to the gate structures described in other embodiments (i.e., the gate structures 102N, 102P), the common gate structure 402 includes a gate electrode 414 intersected with and penetrated through by the channel structures 106N, 106P, and includes gate dielectric layers 416 separating the channel structures 106N, 106P from the gate electrode 414. To be shared by the NFET 400N and the PFET 400P, the gate electrode 414 is formed from the ground level to the elevated level, and penetrates through the spacer layer 126. On the other hand, a bottom group of the gate dielectric layers 416 may wrap around the channel structures 106N at the ground level, while a top group of the gate dielectric layers 416 may wrap around the channel structures 106P at the elevated level. Although not shown, one or more work function layer(s) may lie between the gate electrode 414 and the gate dielectric layers 416, and interfacial layers may respectively extend between one of the channel structures 106N, 106P and the covering gate dielectric layer 416.

As shown in FIG. 4C, the common sidewall spacer 422 cover opposite sidewalls of the common gate structure 402, to ensure physical and electrical separation between the gate electrode 414 of the common gate structure 402 and the source/drain contacts 104N, 104P. To be shared by the NFET 400N and the PFET 400P, the common sidewall spacer 422 is formed from the ground level to the elevated level, and is penetrated through by end portions of the channel structures 106N, 106P.

As an example, the stack of the NFET 400N and the PFET 400P can be interconnected to form an inverter similar to the inverter 200 described with reference to FIG. 2B through FIG. 2F, except that the conductive via 206 for connecting vertically separate gate structure is no longer required. However, instead of being limited to an inverter, the stack of the NFET 400N and the PFET 400P can be implemented in any of other logic devices including a combination of a NFET and a PFET with connected gate terminals.

As above, a complementary field effect transistor including an NFET and a PFET stacked along a vertical direction is provided. As compared to deploying an NFET and a PFET at the same height, vertically stacking the NFET and the PFET can resulted in a much smaller total footprint area. Further, as utilizing carrier mobility anisotropy for both the NFET and the PFET, the NFET is formed with channel structures as thin sheets having major planar surfaces being (100) crystalline planes, while the PFET is formed with channel structure as thin walls having major sidewalls being (110) crystalline planes. Accordingly, carrier mobility of the NFET and the PFET can be optimized independently. In terms of application, the vertically stacked NFET and PFET can be interconnected to form a basic logic element (such as an inverter), and can be powered by buried power rails. Further, a plurality of the complementary field effect transistors may be routed to form an integrated circuit with enhanced integration density and optimized operation speed.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In an aspect of the present disclosure, a semiconductor device is provided. The semiconductor device comprises: a first field effect transistor (FET), disposed on a semiconductor substrate, and comprising first channel structures, wherein the first channel structures are vertically separated from one another, and formed as thin sheets each having opposite major planar surfaces facing toward and away from the semiconductor substrate; and a second FET, disposed on the semiconductor substrate and overlapped with the first FET, wherein a conductive type of the second FET is complementary to a conductive type of the first FET, second channel structures of the second FET are separately arranged along a lateral direction, and formed as thin walls.

In another aspect of the present disclosure, a semiconductor device is provided. The semiconductor device comprises: a semiconductor substrate; an N-type field effect transistor (NFET), disposed on the semiconductor substrate, and comprising first two-dimensional channel structures separated from one another, and having major surfaces spanning along a first lateral direction and a second lateral direction substantially perpendicular to the first lateral direction; and a P-type filed effect transistor (PFET), disposed on the semiconductor substrate and overlapped with the NFET, wherein second two-dimensional channel structures of the PFET are laterally spaced apart from one another, and have major surfaces spanning along the second lateral direction and a substantially vertical direction.

In yet another aspect of the present disclosure, a semiconductor device is provided. The semiconductor device comprises: an N-type field effect transistor (NFET), disposed on a semiconductor substrate, and comprising first channel structures, wherein the first channel structures are formed as thin sheets vertically separated from one another; a P-type field effect transistor (PFET), disposed on the semiconductor substrate and overlapped with the NFET, wherein second channel structures of the PFET are formed as thin walls separately arranged along a lateral direction; and first and second buried power rails, embedded in an isolation structure formed into the semiconductor substrate, and configured to power the NFET and the PFET.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first field effect transistor (FET), disposed on a semiconductor substrate, and comprising first channel structures and a first gate structure, wherein the first channel structures are vertically separated from one another, and formed as thin sheets each having opposite major planar surfaces facing toward and away from the semiconductor substrate, and the first gate structure is intersected with and laterally penetrated by the first channel structures; and
   a second FET, disposed on the semiconductor substrate and overlapped with the first FET, wherein a conductive type of the second FET is complementary to a conductive type of the first FET, second channel structures of the second FET are separately arranged along a lateral direction, and formed as thin walls, a second gate structure of the second FET is intersected with and laterally penetrated by the second channel structures, and a portion of the second gate structure is located between bottom surfaces of the second channel structures and the semiconductor substrate.

2. The semiconductor device according to claim 1, wherein the major planar surfaces of the first channel structures are (100) crystalline planes, and major sidewalls of the second channel structures are (110) crystalline planes.

3. The semiconductor device according to claim 2, wherein a top surface of the semiconductor substrate is a (100) crystalline plane.

4. The semiconductor device according to claim 1, wherein the second gate structure of the second FET is overlapped with and vertically separated from the first gate structure.

5. The semiconductor device according to claim 4, wherein the bottom surfaces of the second channel structures are elevated from a bottom surface of the second gate structure.

6. The semiconductor device according to claim 1, wherein the first gate structure and the second gate structure are integrally formed as a common gate structure, and the common gate structure wraps around both of the first and second channel structures.

7. The semiconductor device according to claim 6, wherein the first channel structures are vertically spaced apart from the second channel structures via a portion of the common gate structure extending in between.

8. The semiconductor device according to claim 1, wherein the first FET further comprises a pair of first source/drain contacts in lateral contact with opposite ends of the first channel structures, and the second FET further comprises a pair of second source/drain contacts in lateral contact with opposite ends of the second channel structures.

9. The semiconductor device according to claim 8,
   wherein the first source/drain contacts respectively comprise a first epitaxial structure grown from the first channel structures and a first contact structure covering the first epitaxial structure,
   wherein the second source/drain contacts respectively comprise a second epitaxial structure grown from the second channel structures and a second contact structure covering the second epitaxial structure.

10. The semiconductor device according to claim 8, wherein the first source/drain contacts are overlapped with and vertically spaced apart from the second source/drain contacts.

11. The semiconductor device according to claim 1, wherein the first FET is stacked on the second FET.

12. The semiconductor device according to claim 1, wherein the second FET is stacked on the first FET.

13. A semiconductor device, comprising:
    a semiconductor substrate;
    an N-type field effect transistor (NFET), disposed on the semiconductor substrate, and comprising first two-dimensional channel structures and a pair of first source/drain contacts, wherein the first two-dimensional channel structures are separated from one another, and have major surfaces spanning along a first lateral direction and a second lateral direction substantially perpendicular to the first lateral direction, the pair of first source/drain contacts are in lateral contact with opposite ends of the first two-dimensional channel structures, and the first source/drain contacts respectively comprise a first epitaxial structure grown from the first two-dimensional channel structures and a first contact structure covering the first epitaxial structure; and a P-type filed effect transistor (PFET), disposed on the semiconductor substrate and overlapped with the NFET, and comprising second two-dimensional channel structures and a pair of second source/drain contacts, wherein the second two-dimensional channel structures are laterally spaced apart from one another, and have major surfaces spanning along the second lateral direction and a substantially vertical direction, the pair of second source/drain contacts are in lateral contact with opposite ends of the second two-dimensional channel structures, and the second source/drain contacts respectively comprise a second epitaxial structure grown from the second channel structures and a second contact structure covering the second epitaxial structure.

14. The semiconductor device according to claim 13, wherein the NFET is embedded in a first dielectric layer, and the PFET is embedded in a second dielectric layer vertically spaced apart from the first dielectric layer.

15. The semiconductor device according to claim 14, further comprising a spacer layer extending in between the first and second dielectric layers.

16. A semiconductor device, comprising:
an N-type field effect transistor (NFET), disposed on a semiconductor substrate, and comprising first channel structures, wherein the first channel structures are formed as thin sheets vertically separated from one another;
a P-type field effect transistor (PFET), disposed on the semiconductor substrate and overlapped with the NFET, wherein second channel structures of the PFET are formed as thin walls separately arranged along a lateral direction; and
first and second buried power rails, embedded in an isolation structure formed into the semiconductor substrate, and configured to power the NFET and the PFET.

17. The semiconductor device according to claim 16, wherein the first and second buried power rails respectively comprise:
a buried conductive line;
an insulating capping layer, extending along a top surface of the buried conductive line; and
an insulating liner, separating the buried conductive line and the insulating capping layer from the isolation structure.

18. The semiconductor device according to claim 17, wherein a source/drain contact in the NFET is connected to the buried conductive line of the first buried power rail through a conductive via penetrating through the insulating capping layer of the first buried power rail, and a source/drain contact in the PFET is connected to the buried conductive line of the second buried power rail through a conductive via penetrating through the insulating capping layer of the second buried power rail.

19. The semiconductor device according to claim 18, wherein the first and second channel structures are overlapped with each other, and the first and second power rails laterally extend at opposite sides of the first and second channel structures.

20. The semiconductor device according to claim 16, wherein the NFET and the PFET are interconnected through at least one conductive via penetrating through a spacer layer separating the NFET and the PFET from each other.

* * * * *